United States Patent
Xia et al.

(10) Patent No.: US 6,177,344 B1
(45) Date of Patent: Jan. 23, 2001

(54) BPSG REFLOW METHOD TO REDUCE THERMAL BUDGET FOR NEXT GENERATION DEVICE INCLUDING HEATING IN A STEAM AMBIENT

(75) Inventors: Li-Qun Xia, San Jose, CA (US); Richard A. Conti, Mount Kisco; Maria Galiano, Fishkill, both of NY (US); Ellie Yieh, Millbrae, CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/199,911

(22) Filed: Nov. 25, 1998

(51) Int. Cl.[7] ........................ H01L 21/4763; H01L 21/31; H01L 21/469
(52) U.S. Cl. ..................... 438/646; 438/760; 438/763
(58) Field of Search .................................. 438/760, 763, 438/646

(56) References Cited

U.S. PATENT DOCUMENTS

| 4,606,114 | 8/1986 | Kraus | 29/571 |
|---|---|---|---|
| 5,285,102 | * 2/1994 | Ying . | |

(List continued on next page.)

FOREIGN PATENT DOCUMENTS

| 0 673 062 A2 | 9/1995 | (EP) | H01L/21/768 |
|---|---|---|---|
| 63-226933 | 9/1988 | (JP) | H01L/21/31 |

OTHER PUBLICATIONS

Mitra et al., Low–temperature polysilicon TFT with gate oxide grown by high–pressure oxidation, IEEE Electron Device Letters, vol. 12, No. 7, Jul. 1991.*
U.S. application No. 09/076,170, Xia et al., filed May 5, 1998.

R.P.S. Thakur et al., "Reduced Thermal Budget Borophosphosilicate Glass (BPSG) Fusion and Implant Activation Using Rapid Thermal Annealing and Steam Reflow," *Materials Research Society Symposium Proceedings*—Apr. 12–15, 1993, San Francisco, CA, vol. 303, pp. 283–288 (Apr. 1993).

(List continued on next page.)

*Primary Examiner*—John F. Niebling
*Assistant Examiner*—Ron Pompey
(74) *Attorney, Agent, or Firm*—Townsend and Townsend and Crew

(57) ABSTRACT

A multistep method for planarizing a silicon oxide insulating layer such as a deposited borophosphosilicate glass (BPSG) layer. The method includes several different planarization stages. During an initial, pre-planarization stage, a substrate having a BPSG layer deposited over it is loaded into a substrate processing chamber. Then, during a first planarization stage after the pre-planarization stage, oxygen and hydrogen are flowed into the substrate processing chamber to form a steam ambient in said chamber and the substrate is heated in the steam ambient from a first temperature to a second temperature. The first temperature is below a reflow temperature of the BPSG layer and the second temperature is sufficient to reflow the layer. After the substrate is heated to the second temperature during a second planarization stage, the temperature of the substrate and the conditions within the substrate processing chamber are maintained at conditions sufficient to reflow the BPSG layer in the steam ambient. In a more preferred embodiment, the multistep planarization method also includes a third planarization stage, after the second stage. In the third planarization stage, the flow of hydrogen is stopped while the flow of oxygen is maintained, thereby forming an oxygen ambient in the substrate processing chamber. The substrate temperature is maintained in the oxygen ambient at a temperature above the reflow temperature of the BPSG layer. It is believed that this additional step minimizes the amount of moisture incorporated into the reflowed BPSG layer.

23 Claims, 2 Drawing Sheets

U.S. PATENT DOCUMENTS

| | | | |
|---|---|---|---|
| 5,314,847 | * | 5/1994 | Watanabe et al. . |
| 5,384,288 | | 1/1995 | Ying ..................................... 437/228 |
| 5,474,955 | * | 12/1995 | Thakur . |
| 5,646,075 | | 7/1997 | Thakur et al. ........................ 437/247 |
| 5,656,556 | * | 8/1997 | Yang . |
| 5,856,695 | * | 1/1999 | Ito et al. . |

OTHER PUBLICATIONS

M. Yoshimaru et al., "Microcrystal Growth on Borophosphosilicate Glass Film During High-temperature Annealing," *Journal of the Electrochemical Society*, vol. 143, No. 2, pp. 666–671 (Feb. 1996).

* cited by examiner

BPSG REFLOW METHOD TO REDUCE THERMAL BUDGET FOR NEXT GENERATION DEVICE INCLUDING HEATING IN A STEAM AMBIENT

BACKGROUND OF THE INVENTION

The present invention relates to the formation of a borophosphosilicate glass ("BPSG") layer during the fabrication of integrated circuits on semiconductor wafers. More particularly, the present invention relates to an improved reflow process that may reduce the thermal budget of a fabrication process while providing gap-filling properties that enable the BPSG layer to meet the requirements of modem day manufacturing processes.

Silicon oxide is widely used as an insulating layer in the manufacture of semiconductor devices. A silicon oxide film can be deposited by thermal chemical vapor deposition (CVD) or plasma enhanced chemical vapor deposition (PECVD) processes from a reaction of silane ($SiH_4$), tetraethoxysilane ($Si(OC_2H_5)_4$), hereinafter referred to as "TEOS," or a similar silicon-containing source, with an oxygen-containing source such as $O_2$, ozone ($O_3$), or the like.

One particular use for a silicon oxide film is as a separation layer between the polysilicon gate/interconnect layer and the first metal layer of MOS transistors. Such separation layers are referred to as premetal dielectric (PMD) layers because they are typically deposited before any of the metal layers in a multilevel metal structure. In addition to having a low dielectric constant, low stress and good adhesion properties, it is important for PMD layers to have good planarization and gap-fill characteristics.

When used as a PMD layer, the silicon oxide film is deposited over a silicon substrate having a lower level polysilicon gate/interconnect layer. The surface of the silicon substrate may include isolation structures, such as trenches, and raised or stepped surfaces, such as polysilicon gates and interconnects. The initially deposited film generally conforms to the topography of the substrate surface and is typically planarized or flattened before an overlying metal layer is deposited.

Several methods have been developed to fill the gaps and "planarize" or "flatten" the substrate surface. Examples include depositing a conformal layer of silicon oxide (or another material) of sufficient thickness and polishing the wafer to obtain a flat surface; depositing a conformal layer of silicon oxide (or another material) of sufficient thickness and etching the layer back to form a planarized surface; and forming a layer of relatively low-melting-point silicon oxide and then heating the substrate sufficiently to cause the layer to melt and flow as a liquid, resulting in a flat surface upon cooling. Such heating can be performed using either a rapid thermal pulse (RTP) method or conventional furnace, for example, and can be done in a dry (e.g., $N_2$ or $O_2$) or wet (e.g., steam $H_2/O_2$) ambient. Each process has attributes that make that process desirable for a specific application.

Because of its low dielectric constant, low stress, good adhesion and gap-fill properties and relatively low reflow temperature, borophosphosilicate glass ("BPSG") is one silicon oxide film that has found particular applicability in applications that employ a reflow step to planarize PMD layers. Standard BPSG films are formed by introducing a phosphorus-containing source and a boron-containing source into a processing chamber along with the silicon- and oxygen-containing sources normally required to form a silicon oxide layer. Examples of phosphorus-containing sources include triethylphosphate (TEPO), triethylphosphite ($TEP_i$), trimethylphosphate (TMOP), trimethylphosphite ($TMP_i$), and similar compounds. Examples of boron-containing sources include triethylborate (TEB), trimethylborate (TMB), and similar compounds.

As semiconductor design has advanced, the feature size of the semiconductor devices has dramatically decreased. Many integrated circuits (ICs) now have features, such as traces or trenches that are significantly less than a micron across. While the reduction in feature size has allowed higher device density, more chips per wafer, more complex circuits, lower operating power consumption, and lower cost, the smaller geometries have also given rise to new problems, or have resurrected problems that were once solved for larger geometries.

One example of a manufacturing challenge presented by submicron devices is the ability to completely fill a narrow trench in a void-free manner. To fill a trench with BPSG, a layer of BPSG is first deposited on the patterned substrate. The BPSG layer typically covers the field, as well as the walls and bottom of the trench. If the trench is wide and shallow, it is relatively easy to completely fill the trench with BPSG. As the trench gets narrower and the aspect ratio (the ratio of the trench height to the trench width) increases, it becomes more likely that the opening of the trench will "pinch off."

Pinching off a trench traps a void within the trench. Under certain conditions, the void will be filled during the reflow process; however, as the trench becomes narrower, it becomes more likely that the void will not be filled during the reflow process. Such voids are undesirable as they can reduce the yield of good chips per wafer and the reliability of the devices. Therefore, it is desirable to be able to fill narrow gaps with BPSG in a void-free manner. It is also desirable that the processes used to deposit and reflow the BPSG layer be efficient, reliable, and result in a high yield of devices.

Another manufacturing challenge presented by submicron devices is minimizing the overall thermal budget of the IC fabrication process in order to maintain shallow junctions and prevent the degradation of self-aligned titanium silicide contact structures among other reasons. One way to reduce the overall thermal budget of a fabrication process is to reduce the reflow temperature of the BPSG PMD layer to below 800° C. and even more preferably to below 750° C.

SUMMARY OF THE INVENTION

The present invention provides an improved method of reflowing a silicon oxide insulating layer, such as a BPSG layer, that enables the layer to meet modem day and future manufacturing requirements. The method of the present invention enables an appropriately doped BPSG layer to be reflowed at a temperature of 750° C. or below while exhibiting gap-filling properties sufficient to planarize narrow trenches having very high aspect ratios, e.g., aspect ratios of 6:1 or more at trench widths of 0.06 and 0.08 microns.

According to the method of the present invention, a multistep sequence for planarizing a silicon oxide insulating layer, such as a BPSG layer, is provided. The method includes different planarization stages. During an initial, pre-planarization stage, a substrate having a BPSG or other silicon oxide layer deposited over it is loaded into a substrate processing chamber. Then, during a first planarization stage after the pre-planarization stage, oxygen and hydrogen are flowed into the substrate processing chamber to form a steam ambient in the chamber and the substrate is heated in the steam ambient from a first temperature to a second temperature. The first temperature is below a reflow temperature of the BPSG layer and the second temperature is sufficient to reflow the layer. After substrate is heated to the second temperature, during a second planarization stage, the temperature of the substrate and the conditions within the substrate processing chamber are maintained at conditions sufficient to reflow the BPSG layer in the steam ambient.

It has been discovered that heating the BPSG layer in this manner (i.e., ramping-up the temperature of the layer in the presence of the steam ambient) improves the reflow characteristics of the BPSG layer thereby improving the gap-fill characteristics of the layer. The inventors believe that the improved gap-fill characteristics are achieved because steam is able to diffuse into the narrow trenches and gaps before the film densifies during the reflow process.

In a preferred embodiment, the multistep planarization method also includes a third planarization stage, after the second stage. In the third planarization stage, the flow of hydrogen is stopped while the flow of oxygen is maintained thereby forming an oxygen ambient in the substrate processing chamber. The substrate temperature is maintained in the oxygen ambient at a temperature above the reflow temperature of the BPSG layer for a reflow period prior to allowing the layer to cool to a temperature below its reflow temperature. It is believed that this additional step minimizes the amount of moisture incorporated into the reflowed BPSG layer.

In another preferred embodiment, the pre-planarization stage includes flowing oxygen into the substrate processing chamber to form an oxygen ambient in the chamber prior to the formation of the steam ambient. In still another preferred embodiment, the substrate is subjected to a temperature above 575° C. (the autoignition temperature of $H_2$ in $O_2$) and below 700° C. in an oxygen ambient in the pre-planarization stage in order to minimize temperature ramp time in subsequent steps. And in still another preferred embodiment, the BPSG layer is reflowed at a temperature of 750° C. or less.

These and other embodiments of the present invention along with many of its advantages and features are described in more detail in conjunction with the text below and attached figures.

BRIEF DESCRIPTION OF THE DRAWINGS

FIG. 2A depicts a BPSG layer prior to a reflow sequence and FIG. 2B depicts a BPSG layer after a prior art reflow sequence that left a void of generally spheroid shape in a narrow width, high aspect-ratio trench formed on the substrate surface;

DESCRIPTION OF THE SPECIFIC EMBODIMENTS

The present invention provides an improved method of reflowing a BPSG or other silicon oxide layer. The improved reflow method enables high aspect ratio, small width trenches or gaps to be filled at a relatively low reflow temperature, thereby reducing the overall thermal budget of a fabrication process. The method of the present invention is capable of reflowing appropriately formed BPSG layers to fill trenches having aspect ratios of 6:1 or more and trench widths as small as 0.06 microns. The improved reflow method is compatible with current industry standard fabrication sequences and with furnaces and other substrate processing chambers of conventional design.

Figure 1:
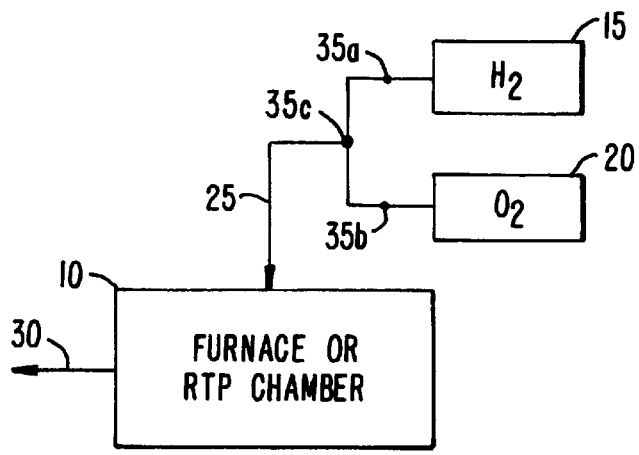
FIG. 1 is a simplified block diagram of a conventional furnace in which the method of the present invention may be practiced.

FIG. 1 is a simplified block diagram of a substrate processing chamber such as conventional furnace in which the improved BPSG reflow method according to the present invention can be practiced. As shown in FIG. 1, a conventional furnace 10, such as an MRL Horizontal Furnace manufactured by MRL Corporation, includes a gas input line 25 that connects to the furnace through an inlet (not shown) and an exhaust output line 30 that includes a throttle valve (not shown) to regulate the pressure within furnace 10. Gas input line 25 is connected to a hydrogen supply ($H_2$) and an oxygen supply ($O_2$) through control valves 35a, 35b and 35c that allow either or both $H_2$ and $O_2$ to be flowed into furnace 10.

Figure 2A:
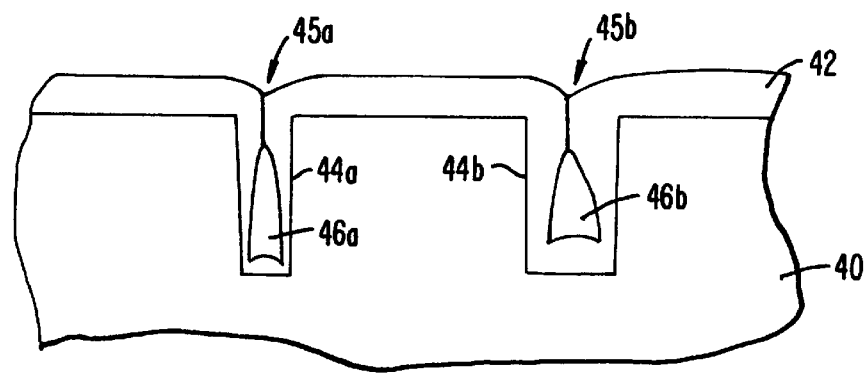
FIGS. 2A and 2B are simplified cross-sectional views of a semiconductor substrate having a BPSG layer deposited over the substrate's surface.

Furnace 10 can be used to reflow a BPSG or other type of silicon oxide film deposited over a semiconductor substrate. FIG. 2A is a simplified, cross-sectional view of a substrate 40 at an intermediate stage of the fabrication of integrated circuits upon the substrate. FIG. 2A shows substrate 40 just after a BPSG layer 42 has been deposited over the substrate's surface. As shown in FIG. 2A, at this stage of fabrication substrate 40 may include a narrow trench area 44a and a wide trench area 44b formed during a processing step prior to the deposition of BPSG layer 42. After the deposition of BPSG layer 42, trench areas 44a and 44b are only partially filled because layer 42 has been "pinched off" in areas 45a and 45b during the deposition process leaving behind voids 46a and 46b. The deposition process is typically performed below atmospheric pressure, so the voids 46a and 46b are evacuated.

Figure 3:
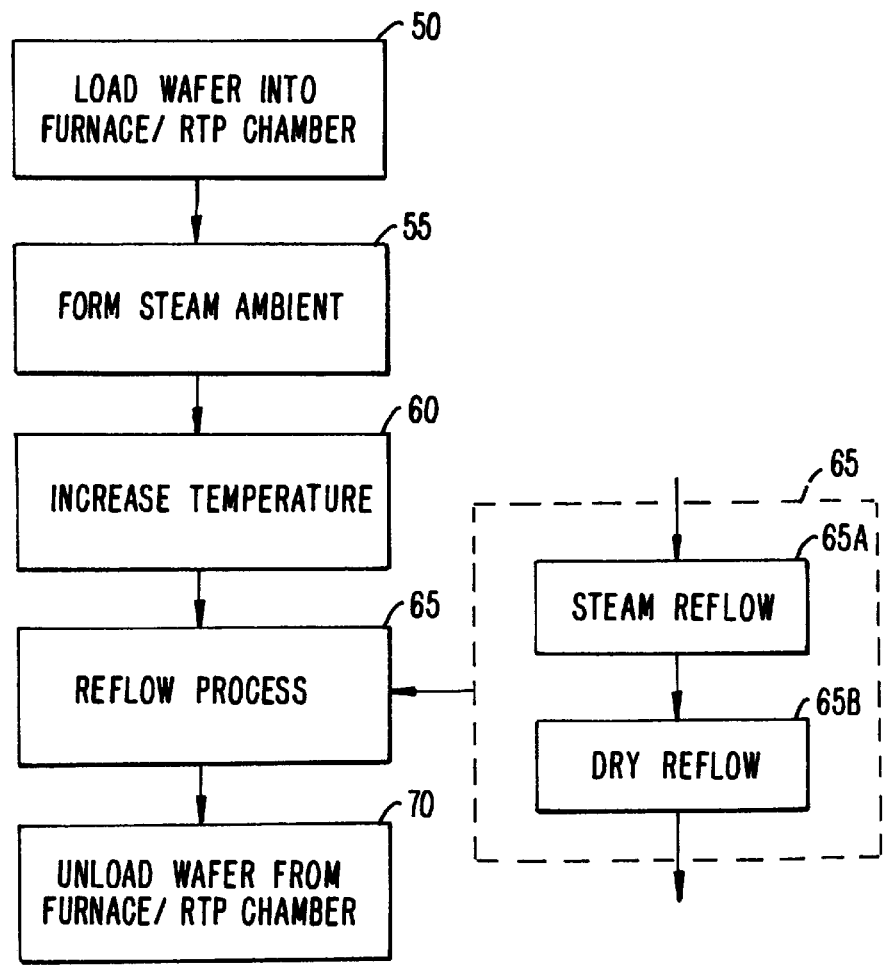
FIG. 3 is a flowchart illustrating steps undertaken in the planarization of a BPSG layer according to the method of the present invention.

FIG. 3 is a flowchart illustrating the steps undertaken in the planarization of a BPSG layer, such as layer 42 shown in FIG. 2A, according to one embodiment of the method of the present invention. As shown in FIG. 3, the first step includes loading a substrate (e.g., substrate 40) into a furnace, such as furnace 10 shown in FIG. 1, or into another type of substrate processing chamber in which the substrate can be heated (FIG. 3A, step 50).

During the substrate loading process, oxygen from oxygen source 20 is flowed into furnace 10 creating an oxygen ambient in the furnace and the furnace temperature is set above 575° C. and below 700° C. It is preferable that the substrate be loaded into an oxygen ambient as this reduces the risk of exposing an operator to an $H_2/O_2$ flame when the furnace door is opened to accept the substrate. In other embodiments, however, the substrate can be loaded directly into a steam ambient provided appropriate safety measures are taken or appropriate safety features are built into the furnace to protect operators from any $H_2/O_2$ flame (e.g., if steam is added to the furnace through a water injection system or evaporator).

The loading temperature is set to above 575° C. in order to minimize the temperature ramp time that is subsequently required to get the substrate and BPSG layer 42 to the layer's reflow temperature. The loading temperature is set below 700° C. in order to minimize BPSG film densification prior to the formation of the steam ambient. In a more preferred embodiment, the loading temperature is set to between 575° C. (the autoignition temperature of $H_2$ in $O_2$) and 650° C.

Approximately 2 minutes after the wafer has been loaded and the door to furnace 10 closed, hydrogen from hydrogen source 25 is flowed into furnace 10 to provide a steam ($H_2/O_2$) ambient (step 55). The temperature of furnace 10 is then increased from its initial setting to a temperature above the reflow temperature of BPSG layer 42 with the optimum rate being decided based on the reflow temperature used, throughput issues and the susceptibility of the wafer to cracking among other things. In a preferred embodiment, this temperature increase occurs at a rate of 2° C. per minute or less over a 10 to 30 minute period. The actual time for step 55 depends on the initial temperature setting of furnace 10, the temperature selected to reflow layer 42, the glass transition temperature of layer 42 and the temperature ramping rate, among other factors.

The present inventors have discovered that increasing the temperature of layer 42 from a temperature below the layer's reflow temperature to a temperature above the layer's reflow temperature in a steam ambient provides superior gap-filling properties as compared to increasing the temperature in an oxygen or nitrogen ambient and then forming a steam ambient after the reflow temperature is reached. As layer 42 is heated to a temperature approaching or above the reflow temperature of the layer, layer 42 densifies. It is believed that the improved gap-filling capabilities achieved by ramping the temperature in the manner taught by the present application are a result of the steam being able to diffuse through the BPSG layer into trenches 44a and 44b prior to the densification of layer 42.

Once the reflow temperate is reached, substrate 40 is kept in furnace 10 in order to reflow and thus planarize layer 42 (step 65). The reflow process (as well as steps 50, 55 and 60) is done at atmospheric or higher pressure, so as the BPSG layer melts and flows, material from the walls of trenches 44a and 44b are drawn into the voids by the vacuum. Generally, step 65 lasts for between 20 to 40 minutes depending on the temperature used to reflow the layer and the desired degree of planarization. Lower temperatures and higher degrees of planarization require a longer reflow step than higher temperature and lower degrees of planarization. After layer 42 is planarized, the furnace temperature is reduced to a temperature below the reflow temperature of layer 42 and the substrate is unloaded from furnace 10 (step 70).

In a preferred embodiment, the reflow process of step 65 includes two substeps: step 65a and step 65b. In step 65a, layer 42 is reflowed in a steam ambient for between about 20 and 30 minutes. Then, in step 65b prior to unloading the substrate, the hydrogen flow is stopped in order to anneal layer 42 in an oxygen only ambient. This step is referred to as a "dry anneal" step. Preferably, step 65b lasts for between 2 and 10 minutes. The furnace temperature may also be ramped down during step 65b at a rate up to approximately 30° C./minute.

Figure 4:
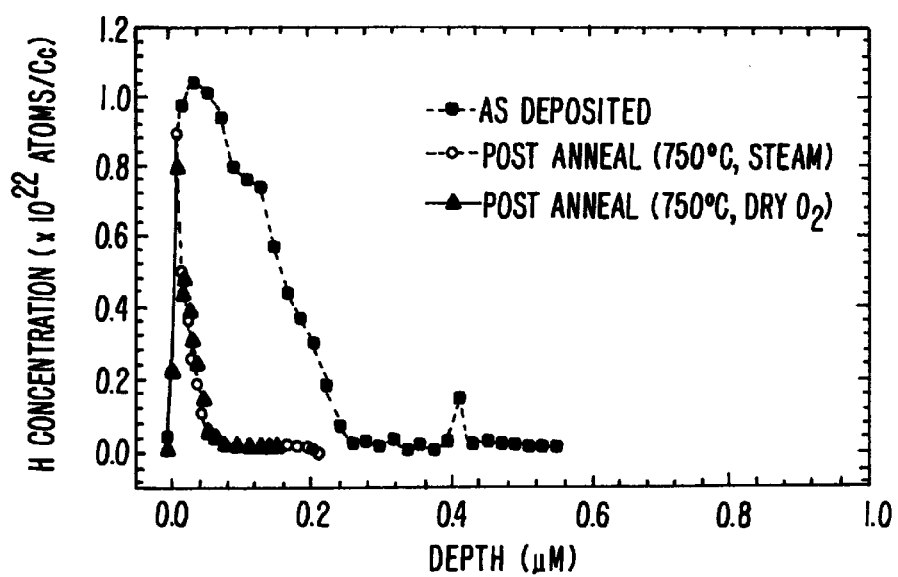
FIG. 4 is a graph depicting the hydrogen content of a BPSG layer planarized according to the method of the present invention.

The use of a dry anneal step helps minimize the hydrogen and moisture content inside of layer 42. Tests run by the present inventors on BPSG layers have indicated that, after reflowing, BPSG layers reflowed according to the method of the present invention exhibit no more hydrogen than BPSG layers reflowed solely in a dry (e.g., $N_2$ or $O_2$) ambient. A graph depicting these test results (hydrogen concentration on the Y-axis and layer depth on the X-axis) is shown in FIG. 4. As shown in FIG. 4, the hydrogen concentration profile (plot using open circles) of a BPSG layer annealed using a 750° C. steam anneal according to steps 50, 55, 60, 65a and 65b and 70 described above is essentially identical to the hydrogen concentration profile (plot using solid triangles) of the same type of BPSG layer annealed using a 750° C. anneal process in an $O_2$ ambient.

In an alternate embodiment, the furnace shown in FIG. 3 is of the rapid thermal processor (RTP) type wherein rates of change of wafer temperature as high at ±50 to 100° C./second are possible. A wafer is loaded (step 50) into the RTP chamber at a temperature of less than about 650–700° C. in an oxygen ambient. When the door to the RTP chamber is closed, wet $O_2$ is flowed into the chamber and the temperature is increased to a temperature above the glass transition temperature of the BPSG layer at a rate of 50–100° C./second The actual time for step 55 depends on the initial temperature of the RTP chamber, the glass transition temperature, the temperature selected to reflow layer 42, and the temperature ramping rate among other factors.

Once the reflow temperature is reached, substrate 40 is kept in the RTP chamber 10 in order to reflow and thus planarize layer 42 (step 65). The reflow process (as well as steps 50, 55 and 60) is done preferably at atmospheric or higher pressure, so that as the BPSG layer melts and flows, material from the walls of trenches 44A and 44B are drawn into the voids by the vacuum. Generally, step 65 lasts for between about 10–90 seconds depending on the temperature used to reflow the layer and the desired degree of planarization. After the layer 42 is planarized, the RTP chamber is ramped down to a temperature below the glass transition temperature of layer 42 at a rate of 50–100° C./second and the substrate is unloaded from RTP 10 (step 70).

In a preferred embodiment using the RTP type furnace, the reflow process of step 65 includes two substeps: Step 65A and 65B. In step 65A, layer 42 is reflowed in a wet $O_2$ ambient for between about 5–60 seconds. Then in step 65B prior to unloading the substrate, the flow of $H_2O$ is stopped in order to anneal layer 42 in an oxygen only (or other $H_2O$-free ambient). This step is referred to as the "dry anneal" step. Step 65B lasts for between 5 and 60 seconds. The temperature of the substrate may also be ramped down during step 65B.

The glass transition temperature of a given BPSG layer, such as layer 42, depends on the boron and phosphorus dopant concentrations of the layer as is understood by persons of ordinary skill in the art. Standard BPSG films typically have between a 2–6 weight percent (wt%) boron concentration, a 2–9 wt% phosphorus concentration and a combined dopant concentration (boron and phosphorus) of less than 11 wt%. Generally speaking, increasing the boron concentration of the BPSG layer is the most significant factor in reducing the reflow temperature of the layer. At boron concentration levels of higher than 6 wt%, however, a given BPSG layer is likely to be susceptible to moisture and diffusion problems.

In a preferred embodiment, BPSG layer 42 is deposited according to a two-step deposition process as disclosed in U.S. patent application Ser. No. 09/076,170 entitled "A TWO-STEP BOROPHOSPHOSILICATE GLASS DEPOSITION PROCESS AND RELATED DEVICES AND APPARATUS" filed on May 5, 1998 and having Li-Qun Xia et al. listed as co-inventors. The 09/076,170 application is hereby incorporated by reference in its entirety.

When BPSG layer 42 is deposited according to the process disclosed in the 09/076,170 application and reflowed according to the method of the present invention, the present inventors have been able to completely fill narrow trenches, such as trench 44a in FIG. 2A, having an aspect ratio of 7:1 and a trench width as small as 0.05 microns. The inventors have also observed superior gap-filling results when a BPSG layer having a given boron and phosphorus dopant concentration deposited according to the 09/076,170 application is reflowed in a steam anneal process that employs the method of the present invention as compared to a process that does not employ the method of the present invention (i.e., the substrate is heated to the BPSG layer's reflow temperature in a dry ambient and then subjected to a steam anneal step). These observations were made when attempting to planarize BPSG layers deposited over narrow (0.09 microns) trenches having aspect ratios of 5:1 and greater.

In these experiments, the present inventors tried a number of different planarization (reflow) processes to planarize the BPSG layer and ensure that the layer completely filled the narrow trench. The planarization processes included reflowing the layer using a RTP process (e.g., heating the layer to 950° C. for about 1 minute in one experiment and heating the layer to 1000° C. for about 10 seconds in another experiment), and using a conventional furnace, such as furnace 10 in FIG. 1, to reflow the layer in a steam ambient without the benefit of the present invention and in dry $O_2$ and $N_2$ ambients. In all cases, the inventors discovered that, for the BPSG of these experiments, none of the various planarization processes employed could fill the gap of the narrow width trench when the aspect ratio of the trench was greater than about 5:1.

Figure 2B:
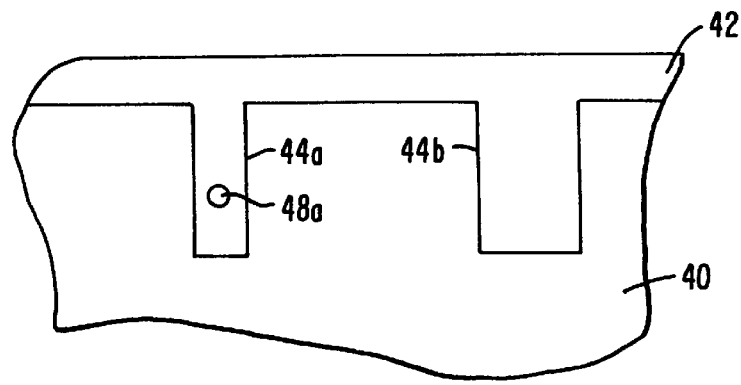

Instead, the inventors observed that a void of generally spheroid shape would form in the higher aspect ratio trenches that would reach a steady-state so that, irrespective of the length of the reflow process, the reflow temperature or the reflow ambient, the void could not be filled at the higher aspect ratios. An example of such a circular void is shown in FIG. 2B as void 48a. Void 48a forms as void 46a (FIG. 2A) begins to close during the reflow process. When using the reflow process of the present invention, however, on the same dopant concentration level BPSG layer, the inventors were able to fill the narrow width trench and eliminate the circular void in trenches having aspect ratios of 6:1 and 7:1.

Having fully described several embodiments of the present invention, many other equivalent or alternative methods of depositing the low dielectric constant oxide layer according to the present invention will be apparent to those skilled in the art. For example, while a preferred embodiment of the present invention loads the substrate (step 50) into a furnace having an $O_2$ ambient, it is also possible to use other dry ambients including $N_2$ in step 50. Additionally, step 65b may use a dry Ar or $N_2$ ambient instead of a dry $O_2$ ambient. These equivalents and alternatives are intended to be included within the scope of the present invention.

What is claimed is:

1. A multistep method for planarizing an insulating layer deposited over a substrate, said method comprising:
    a) loading a substrate having an insulating layer deposited thereover into a substrate processing chamber;
    b) forming a steam ambient within said processing chamber;
    c) thereafter, heating said substrate in said steam ambient by increasing the temperature of said ambient from a first temperature to a second temperature, wherein said first temperature is below a reflow temperature of said insulating layer and said second temperature is sufficient to reflow said insulating layer; and
    d) maintaining said substrate processing chamber at conditions sufficient to reflow said insulating layer in said steam ambient.

2. The method of claim 1 wherein said substrate processing chamber has a first ambient, different from said steam ambient, when said substrate is loaded into said substrate processing chamber during step a.

3. The method of claim 2 wherein said first ambient is an oxygen ambient.

4. The method of claim 1 wherein said insulating layer is a borophosphosilicate glass BPSG layer.

5. A multistep method for planarizing a borophosphosilicate glass (BPSG) layer deposited over a substrate, said method comprising:
    a) during a pre-planarization stage, loading a substrate having a BPSG layer deposited thereover into a substrate processing chamber;
    b) during a first planarization stage after said pre-planarization stage,
        (i) flowing oxygen and hydrogen into said substrate processing chamber to form a steam ambient in said chamber; and
        (ii) heating said substrate in said steam ambient by increasing the temperature of said ambient from a first temperature to a second temperature, wherein said first temperature is below a reflow temperature of said BPSG layer and said second temperature is sufficient to reflow said BPSG layer; and
    c) during a second planarization stage after said first planarization stage, maintaining said substrate processing chamber at conditions sufficient to reflow said BPSG layer in said steam ambient.

6. The method of claim 5 further comprising a third planarization stage, after said second planarization stage, said third planarization stage comprising:
    (i) stopping said hydrogen flow while maintaining said oxygen flow thereby forming an oxygen ambient in said substrate processing chamber; and
    (ii) maintaining said substrate, in said oxygen ambient, at a temperature above said reflow temperature of said BPSG layer.

7. The method of claim 5 wherein said first temperature is between 575° C. and 700° C.

8. The method of claim 7 wherein during said first planarization stage said substrate is heated from said first temperature to said second temperature at a rate of about 2° C. per minute or less.

9. The method of claim 6 wherein said second planarization stage lasts between 20 and 40 minutes.

10. The method of claim 9 wherein said third planarization stage lasts between 2 and 10 minutes.

11. The method of claim 6 wherein said third planarization stage lasts between 2 and 10 minutes.

12. The method of claim 5 wherein said pre-planarization stage further comprises flowing oxygen into said substrate processing chamber to form an oxygen ambient in said chamber.

13. A multistep method for planarizing a borophosphosilicate glass (BPSG) layer deposited over a substrate, said method comprising:
    a) loading a substrate having a BPSG layer deposited thereover in a substrate processing chamber having a heater associated therewith;
    b) flowing oxygen into said substrate processing chamber to create an oxygen ambient in said chamber;
    c) heating said substrate processing chamber at a temperature between about 575° C. and 700° C. while said substrate is in said chamber;
    d) thereafter, flowing hydrogen into said substrate processing chamber to form a steam ambient in said chamber at a temperature between 575° C. and 700° C.;

e) thereafter, increasing the temperature of said steam ambient to a second temperature, wherein said second temperature is above a reflow temperature of said BPSG layer; and f) thereafter, maintaining said substrate processing chamber at conditions sufficient to reflow said BPSG layer.

14. The method of claim 13 wherein step f includes first and second reflow phases and wherein, during said second reflow phase, said hydrogen flow is stopped while said oxygen flow is maintained thereby forming an oxygen ambient.

15. The method of claim 14 wherein, during said first reflow phase, said substrate is heated in said steam ambient for between 20 and 40 minutes.

16. The method of claim 15 wherein, during said second reflow phase, said substrate is heated in said oxygen ambient for between 2 and 10 minutes.

17. The method of claim 14 wherein said second temperature is 750° C. or less and wherein, during step f, said substrate processing chamber is maintained at 750° C. or less.

18. The method of claim 14 wherein, during step e, said substrate is heated from said first temperature to said second temperature during a 20 to 30 minute period.

19. The method of claim 18 wherein, during step e, said substrate is heated to said second temperature at a rate of 2° C. per minute or less.

20. The method of claim 13 wherein, during step (e), said substrate is heated to said second temperature during a 20 to 30 minute period.

21. The method of claim 1 wherein said substrate chamber is a furnace.

22. The method of claim 5 wherein said substrate chamber is a furnace.

23. The method of claim 13 wherein said substrate chamber is a furnace.

* * * * *